United States Patent [19]

Durand

[11] Patent Number: 5,047,260

[45] Date of Patent: Sep. 10, 1991

[54] METHOD FOR PRODUCING A SHIELDED PLASTIC ENCLOSURE TO HOUSE ELECTRONIC EQUIPMENT

[75] Inventor: David Durand, Portsmouth, R.I.

[73] Assignee: Key-Tech, Inc., Cranston, R.I.

[21] Appl. No.: 472,168

[22] Filed: Jan. 3, 1990

Related U.S. Application Data

[60] Division of Ser. No. 365,712, Jun. 14, 1989, Pat. No. 4,960,614, which is a continuation-in-part of Ser. No. 11,975, Feb. 6, 1987, Pat. No. 4,863,757.

[51] Int. Cl.$^5$ ............................................. B05D 3/06
[52] U.S. Cl. ................................. 427/54.1; 204/157.15; 250/506.1; 250/517.1
[58] Field of Search ................. 427/54.1, 58, 128; 204/155, 157.5; 430/31, 311, 325; 320, 542, 631; 250/506.1, 517.1

[56] References Cited

U.S. PATENT DOCUMENTS

| 4,013,462 | 3/1977 | Goffe et al. | 427/145 |
| 4,049,844 | 9/1977 | Bolon et al. | 427/54.1 |
| 4,657,779 | 4/1987 | Gaske | 427/54.1 |

Primary Examiner—John F. Niebling
Assistant Examiner—Kathryn Gorgos
Attorney, Agent, or Firm—Cushman, Darby & Cushman

[57] ABSTRACT

A method for fabricating a shielded plastic enclosure for housing electronic equipment involves applying to at least one interior surface of the enclosure a layer of shielding composition which is a suspension of silver-coated magnetite particles in a U.V. curable resin. The thickness of this layer of shielding material is such that it effectively shields against electromagnetic interference, radio frequency interference and electrostatic discharge. Thereafter the shielding material is cured by exposure to a U.V. source.

5 Claims, 4 Drawing Sheets

METHOD FOR PRODUCING A SHIELDED PLASTIC ENCLOSURE TO HOUSE ELECTRONIC EQUIPMENT

This is a division of application Ser. No. 07/365,712, filed June 14, 1989, now U.S. Pat. No. 4,960,614, which is a continuation-in-part of Ser. No. 07/011,975, filed Feb. 6, 1987, now U.S. Pat. No. 4,863,757.

BACKGROUND OF THE INVENTION

In the past few years, there has been a tremendous amount of activity in the area of replacing "subtractive" printed circuit boards with "additive" printed circuit boards. There are major environmental, economic, and marketing reasons for the interest expressed in this technology. Two of the more important reasons are the growth of the electronic industry and the environmental problems associated with traditional copper "subtractive" circuit boards which consume resources, such as the copper foil itself, as well as the process itself which generates hazardous waste.

In an effort to overcome or minimize the disadvantages associated with the production of "subtractive" printed circuit boards, membrane switch circuit boards were developed in the late seventies and early eighties. These circuit boards were generally silver loaded resin inks printed on polyester films. However, they exhibited rather low voltage and current carrying capabilities and were employed principally in the field of simple switches and not as true printed circuit boards.

It is also important to distinguish additive technologies, such as CC-4 boards which rely on electrodeless copper plating to achieve an additive circuit board from the present invention. The former, which indeed is an additive process, nonetheless continues to produce undesirable effluents even though it offers some cost advantages over the more conventional subtractive techniques. On the other hand, the present invention not only avoids the production of undesirable effluents but also provides economic advantages over systems heretofore employed in the production of printed circuit boards.

Two of the more significant advantages secured by the present invention, not achievable heretofore, are (1) a low cost silver based ink providing low resistance values and being U.V.-curable and (2) a low cost silver based solderable ink which also provides low resistance and is U.V.-curable. In both instances, the present invention provides a circuit trace whose cross section involves a U.V.-curable material in combination with either silver coated glass or silver coated magnetite spheres.

An inherent problem associated with U.V. technology resides in the fact that the U.V. material itself is non-conductive and represents a significant percentage of the conductive ink composition. In many cases, this can be as high as 30 percent U.V.-curable resin and 70 percent conductive material.

While the advantages of the present invention are applicable to planar boards or substrates, it will be appreciated that these same advantages can be secured with non-planar substrates such as, for instance computer keyboards and the like.

The present invention, thus, relates to systems for securing the above noted advantages and for avoiding the disadvantages associated with known methods of producing printed circuit boards.

One of these systems involves curing the U.V. curable resin component of the U.V. curable ink containing spherical conductive particles by subjecting the same to a U.V. source in a pulsing manner.

Another of these systems involves the use of a magnetic field and while under the influence of the magnetic field curing the U.V. curable resin containing spherical magnetite conductive particles by subjecting the same to a U.V. source whether or not in a pulsing manner.

BRIEF DESCRIPTION OF THE DRAWINGS

The features and advantages of the present invention will be more clearly appreciated from the following description taken in conjunction with the accompanying drawings in which:

In FIG. 1 which illustrates a typical dispersion of spherical particles 12 in a resin 10, the problem of having large interstices between the particles filled with resin which is an insulator can be easily seen. On the other hand, in FIG. 2, which is representative of the present invention, the spherical particles 12 are closely packed with only a small amount of resin 10 filling the interstices therebetween.

GENERAL DESCRIPTION OF A FIRST SYSTEM

Figure 1:
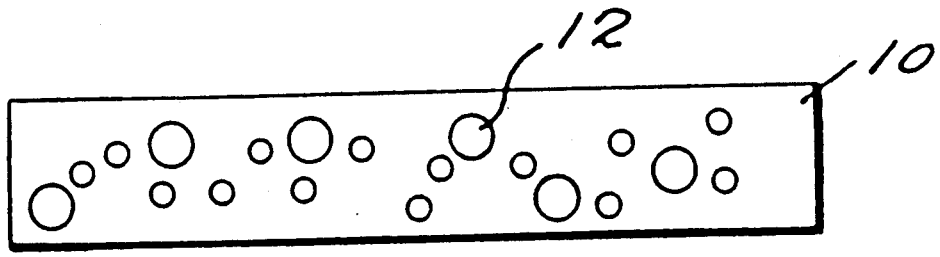
FIG. 1 is a schematic cross-section through an ink film containing conductive spheres, which ink film is not treated in accordance with the present invention.
Figure 2:
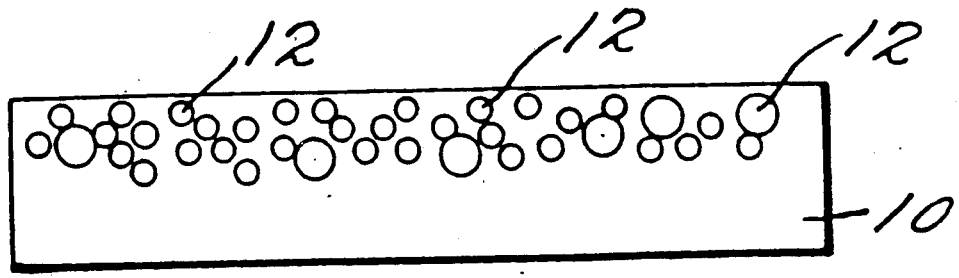
FIG. 2 is a schematic cross-section through an ink film also containing conductive spheres, which ink film has, in accordance with the present invention been subjected to a U.V. source in a pulsing manner or to a U.V. source under the influence of a magnetic field whether or not the U.V. source is applied in a pulsing manner.

It has now been discovered that when a U.V. source with an output in the region between 360 nm and 420 nm is employed in a pulsed mode, a shrinkage of the conductive ink circuitry film occurs whereby shrinkage is facilitated evenly throughout the conductive ink film thickness. This causes the conductive particles to move into closer contact with regard to one another, thus, resulting in the conductive ink circuitry or trace being capable of carrying a greater operating current, as well as lowering the current resistance.

SPECIFIC DESCRIPTION OF THE FIRST SYSTEM

One embodiment of the present invention, thus, relates to a method for producing a circuit board having conductive circuit elements with a specific resistance of less than 0.05 ohm/cm$^2$ patterned on a non-conductive substrate comprising (a) printing a U.V. curable ink onto the nonconductive substrate in a desired circuit pattern and (b) effecting a U.V. radiation cure of the U.V. curable ink by exposing said U.V. curable ink to a U.V. source having an output in the region between 360 nm and 420 nm. The exposure of the ink to the U.V. source is effected in a pulsing manner which comprises 5 to 8 one-half second exposure periods, each exposure period being immediately followed by a non-exposure period of about 2 to 3 seconds. When the ink is cured in accordance with the present invention, a shrinkage of the ink film thickness occurs and is facilitated evenly throughout the conductive ink film thickness. This causes the particles to move into closer contact with one another, thus, resulting in the patterned conductive circuit elements being capable of carrying a greater operating current as well as exhibiting a lower resistance.

The U.V. source employed in the present invention is electrodeless. Instead of using electrodes to feed energy into the discharge, the discharge tube absorbs microwave energy via waveguides into a microwave chamber in which the tube is housed. The lamp system employed in the present invention is modular and consists of two parts; an irradiator and a power supply. The irradiator contains a microwave chamber formed by an anodized aluminum reflector of semi-elliptical cross section with flat ends. The lamp itself is a closed, 10 inch-long tube of transparent vitreous silica varying in internal diameter from 8 mm near the ends to 6 mm at the center. The lamp is located so that its axis lies at the focus of the ellipse and it acts as a dissipative load. Microwave energy is generated by two 1500 watt magnetrons and is fed through waveguides into the chamber via rectangular slots cut in the back of the reflector. The microwave frequency used is 2450 MHz. The magnetrons and waveguides are cooled by a filtered air flow, and this air is also passed through small circular holes cut in the back of the reflector, and over the lamp. In order to better disperse the output of the lamp and fully cure the conductive circuit elements, the surface of the reflector is provided with 1 inch facets much like the surface of a golf ball.

An important factor which dictated the election of an electrodeless U.V. output source is the lack of lamp deterioration associated with electrodes. This deterioration has prevented U.V. resins from being used in a truly viable production of circuit boards of the type produced in accordance with the present invention. One reason for this is that in an electrode lamp the output wavelength will vary with time due to electrode deterioration, and there is a direct relationship between degree of cure of the curable U.V. resin and the current carrying capability of the conductive circuit elements produced therefrom. It has been found that a particularly effective electrodeless lamp is one with iron iodide as a dopant which enhances the spectral output in the wavelength of 360 nm and 420 nm.

Suitable substrates on which the U.V. curable ink of the present invention can be printed, especially for use in membrane switches are generally organic polymer films having the properties of high flexibility, tensile strength, elasticity, dimensional stability and chemical inertness. Transparency is also a frequently desired property for such materials. Materials meeting these criteria include polyolefins such as polyethylene and polypropylene, polycarbonates, polyesters and polyvinyl halides such as polyvinyl chloride and polyvinyl fluoride. The most highly preferred and most widely used substrate material for membrane switches is a polyester film, e.g. MYLAR polyester film.

The U.V. curable ink employed in the present invention comprises from about 33 to 38 weight percent of a thermosetting resin binder and 67 to 62 weight percent of spherical or spheroidal conductive particles having a particle size distribution ranging from 1 to 30 microns.

Representative thermosetting resins usefully employed in the present invention include (1) phenolic resins such as those produced by reacting phenols with aldehydes; (2) amino resins such as the condensation products of urea and of melamine with formaldehyde; (3) unsaturated polyester resins wherein the dibasic acid or the glycol, or both, contain double bonded carbon atoms as exemplified by the following:

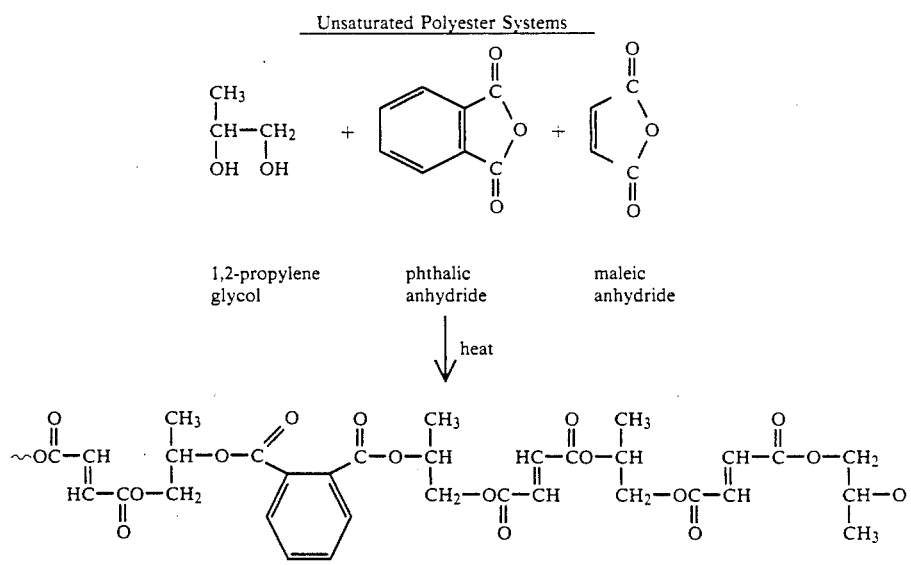

Unsaturated Polyester

Unsaturated acids include maleic anhydride or fumaric acid while when the unsaturation is supplied by the glycol, a saturated acid or anhydride such as phthalic anhydride or adipic, azelaic or isophthalic acid can be employed. Ethylene and propylene glycols are often employed but 1,3- and 2,3-butylene, diethylene and dipropylene glycols are also often used. While styrene is commonly employed, other monomers used include vinyl toluene, methyl methacrylate, diallyl phthalate and triallyl cyanurate; (4) epoxy resins such as the condensation product of epichlorohydrin with bisphenol A, although other hydroxyl-containing compounds such as resorcinol, hydroquinone, glycols and glycerol can be employed and (5) silicone polymers produced by intermolecular condensation of silanols. Other thermosetting resins such as alkyd resins including those based on phthalic anhydride and glycerol, or those based on other polyhydric alcohols such as glycols, pentaerythritol or sorbitol, and other acids such as maleic anhydride, isophthalic and terephthalic acid can acrylated polyethers, such as the following polyether based on 1,2,6-hexane triol and propylene oxide

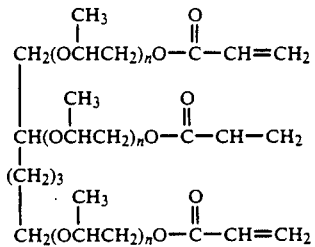

acrylated polyesters, such as those formed from the esterification of polyhydric esters with acrylic acid to yield

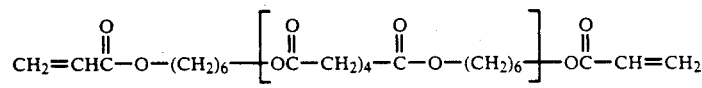

also be used. Still other thermosetting resin binders include allyl resins, e.g. diallyl phthalate and allyl diglycol carbonate, as well as furane resins such as those based on furfuraldehyde in combination with phenol.

Preferably, the thermosetting resin binder employed in the present invention is a formulation of liquid acrylic modified monomers, oligomers and polymers activated by a combination of a ketone photoinitiator and an amine. The resin is synthesized with either a terminal or pendant acrylate group, with a urethane being the preferred oligomer, as follows:

which specifically is a polyester based upon adipic acid and hexanediol; and thio/ene and thio/acrylate systems, such as the polythiols developed by W. Grace and Company, Ltds., penta-erythritol tetrakis (thioglycolate)

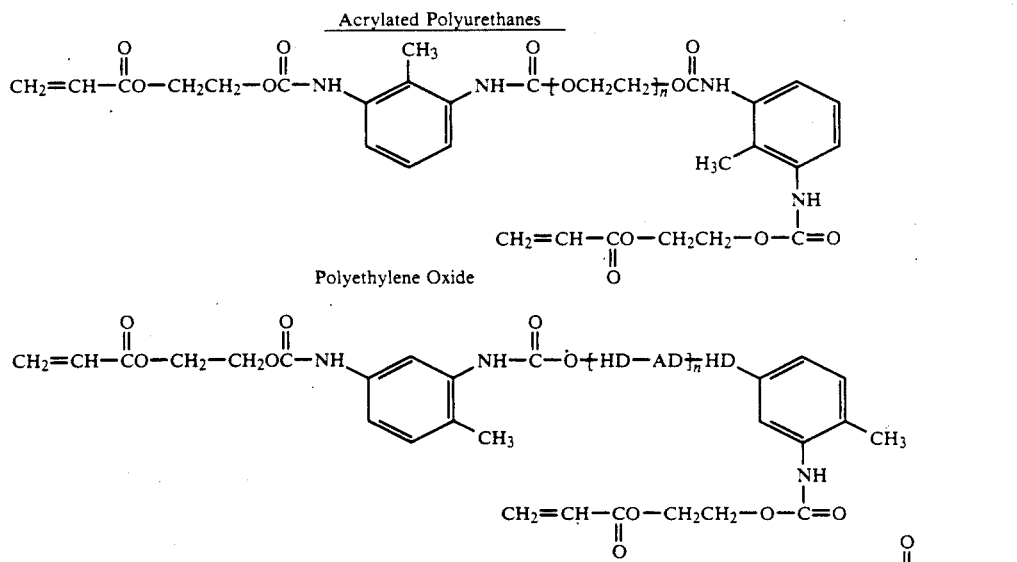

Other suitable resins include acrylated epoxy resins, such as NOVACURE 3700, available from Interez, Inc., having the following chemical formula

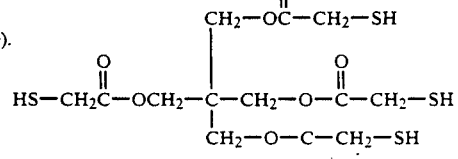

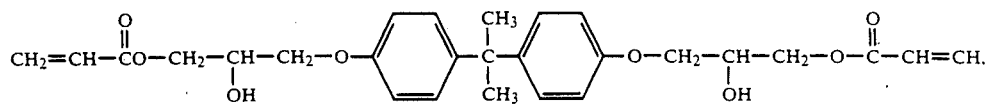

and trimethylol propane tris (β-mercapto propionate)

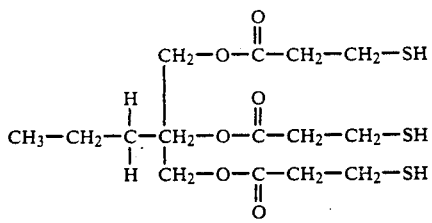

In order to achieve longer wavelength absorption in the range of 360 nm to 420 nm, a ketoneamine adjuvant is employed. Preferably this adjuvant is Michler's ketone since it contains both ketone and amine functionality in one molecule. However, a mixture of benzophenone and Michler's ketone has been found to be particularly effective (1) where the two components are admixed prior to incorporation into the curable ink vehicle, (2) where the spherical or spheroidal conductive particles are silver coated glass spheres and (3) where the latter are present in the U.V. curable ink in an amount greater than 60 weight percent based on the total weight of the curable ink.

The spherical or spheroidal conductive particles employed in the present invention are preferably, silver coated glass spheres having the following characteristics: average particle diameter—15 microns; average particle size distribution—1 to 30 microns; silver coating—12 percent by weight based on the total wight of the spheres; particle density—2.7 g/cc; specific surface area—0.178 m²/g; and minimum percent rounds by microscope—90.

Other particulated materials such as iron, zinc, nickel, copper and the like can also be employed, these particulated materials having a particle size distribution and an average particle size previously defined.

The output spectra of six electrodeless lamps were tested and analyzed for their effectiveness in curing a U.V. curable ink in accordance with the present invention. The results are given below.

Curing mechanism of a U.V. curable acrylate resin utilized in the invention.

| Typical Formulation | CP — 100 | Function |
|---|---|---|
| Monomer | Acrylic monomers | Film-forming |
| Pre-polymer | oligomers, polymers | materials |
| Photo-initiator | mixed ketones with amine | light sensitive chemical |
| Surfactant | non-ionic type | wetting agent |
| Additives | Silica | suspending agent gloss reduction |

An unsaturated polyester mixed with its monomer can be cross linked by U.V. light if a suitable photoinitiator is incorporated. The double bonds in the unsaturated esters provide potential bonding sites for polymerization by free radical processes. Acrylate esters polymerize at a rate which is at least an order of magnitude greater than is found with other unsaturated esters. The pre-polymers are normally very viscous, or even solid, and in order to reduce the viscosity, it has been found convenient to use a diluent. Monoacrylates and some oligomers, with low volatility have been employed. Suitable monomeric diluents include 1. vinyls, for example styrene

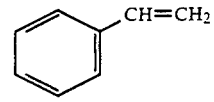

vinyl toluene isomers

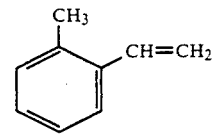 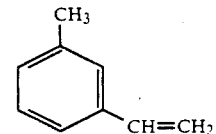

ortho     meta

| Interval (NM) | Lamp A Power (watts) | Lamp A Power (accum) | Lamp D Power (watts) | Lamp D Power (accum) | Lamp M Power (watts) | Lamp M Power (accum) | Lamp M' Power (watts) | Lamp M' Power (accum) | Lamp V Power (watts) | Lamp V Power (accum) | Lamp X Power (watts) | Lamp X Power (accum) |
|---|---|---|---|---|---|---|---|---|---|---|---|---|
| 200–210 | 7.9 | 8 | 7.7 | 8 | 13.4 | 13 | 7.5 | 7 | 0.4 | 0 | 7.1 | 7 |
| 210–220 | 17.0 | 26 | 15.2 | 23 | 42.4 | 56 | 20.9 | 28 | 1.4 | 2 | 22.1 | 29 |
| 220–230 | 25.3 | 51 | 15.8 | 39 | 67.2 | 123 | 31.4 | 60 | 2.9 | 5 | 32.3 | 62 |
| 230–240 | 23.6 | 75 | 14.6 | 53 | 46.2 | 170 | 27.9 | 88 | 3.6 | 8 | 41.3 | 103 |
| 240–250 | 27.6 | 102 | 24.8 | 78 | 303 | 200 | 29.8 | 118 | 7.3 | 16 | 34.5 | 137 |
| 250–260 | 55.7 | 158 | 43.1 | 121 | 101.2 | 301 | 73.1 | 191 | 11.5 | 27 | 55.7 | 193 |
| 260–270 | 38.9 | 197 | 32.1 | 153 | 78.1 | 379 | 79.5 | 270 | 12.5 | 40 | 48.3 | 241 |
| 270–280 | 48.8 | 246 | 42.9 | 196 | 34.7 | 414 | 31.7 | 302 | 12.3 | 52 | 29.3 | 271 |
| 280–290 | 91.0 | 329 | 24.6 | 221 | 28.7 | 443 | 85.1 | 387 | 26.2 | 78 | 38.2 | 309 |
| 290–300 | 39.3 | 366 | 48.6 | 269 | 43.5 | 486 | 26.8 | 414 | 46.5 | 125 | 38.8 | 348 |
| 300–310 | 72.0 | 73 | 56.7 | 57 | 46.2 | 46 | 20.9 | 21 | 16.0 | 16 | 29.1 | 29 |
| 310–320 | 77.6 | 150 | 44.2 | 101 | 92.1 | 138 | 42.5 | 63 | 17.3 | 33 | 51.4 | 80 |
| 320–330 | 64.5 | 215 | 35.5 | 136 | 9.0 | 147 | 10.1 | 74 | 16.4 | 50 | 26.4 | 107 |
| 330–340 | 25.6 | 240 | 20.3 | 156 | 18.4 | 166 | 10.8 | 84 | 20.2 | 70 | 25.9 | 133 |
| 340–350 | 9.3 | 250 | 43.2 | 200 | 5.4 | 171 | 6.9 | 91 | 22.3 | 92 | 53.1 | 186 |
| 350–360 | 48.4 | 298 | 78.0 | 279 | 5.2 | 176 | 26.0 | 117 | 24.4 | 117 | 25.2 | 211 |
| 360–370 | 58.6 | 357 | 93.3 | 373 | 118.9 | 293 | 173.4 | 291 | 35.1 | 152 | 112.1 | 323 |
| 370–380 | 25.2 | 382 | 115.2 | 488 | 8.0 | 307 | 40.2 | 331 | 29.3 | 181 | -15.5 | 339 |
| 380–390 | 37.1 | 419 | 112.1 | 600 | 6.3 | 310 | 9.1 | 340 | 31.5 | 213 | 15.4 | 354 |
| 390–400 | 11.5 | 430 | 41.2 | 641 | 5.9 | 315 | 8.5 | 348 | 35.4 | 240 | 15.4 | 370 |
| 400–410 | 92.9 | 93 | 46.9 | 47 | 50.5 | 50 | 133.0 | 134 | 135.1 | 135 | 40.1 | 40 |
| 410–420 | 10.1 | 103 | 33.5 | 80 | 7.0 | 57 | 17.1 | 151 | 144.0 | 279 | 15.3 | 55 |
| 420–430 | 15.5 | 119 | 44.6 | 125 | 7.9 | 65 | 8.6 | 160 | 76.6 | 256 | 18.5 | 74 |
| 430–440 | 41.0 | 160 | 61.7 | 187 | 79.5 | 145 | 42.9 | 203 | 44.9 | 401 | 71.0 | 145 |
| 440–450 | 30.1 | 190 | 28.2 | 215 | 8.8 | 154 | 11.1 | 214 | 32.5 | 433 | 29.3 | 174 |

-continued

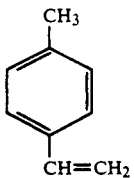

para vinyl acetate

CH₃CO₂CH=CH₂

N-vinyl pyrrolidone

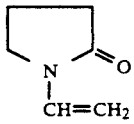

2. acrylics, including
(i) Monoacrylates e.g. n-Butyl acrylate
2-Ethyl hexyl acrylate (EHA)

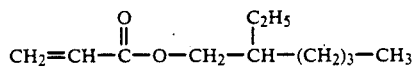

Isodecyl acrylate
Isononyl acrylate

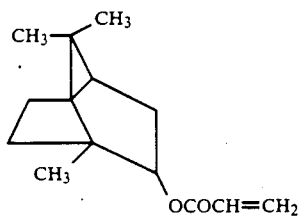

phenoxy ethyl acrylate
Tetrahydryl furfuryl acrylate
2-Hydroxy ethyl acrylate

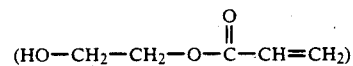

2-Hydroxy propyl acrylate
cyclohexyl acrylate
3-Butoxy-2-hydroxypropyl acrylate (ii) diacrylates 1,4-Butane-diol diacrylate (BDDA)

-continued

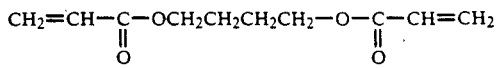

Neopentyl glycol diacrylate (NPGDA)

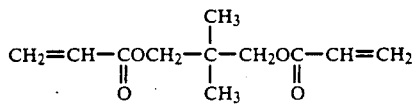

Diethylene glycol diacrylate (DEGDA)

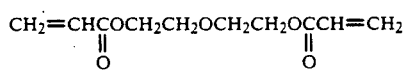

1,6-Hexanediol diacrylate

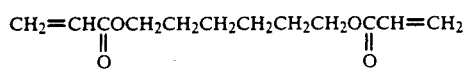

Tripropylene glycol diacrylate (iii) Triacrylates

Trimethylol propane triacrylate

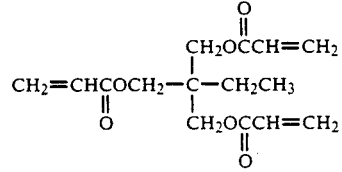

Pentaerythritol triacrylate

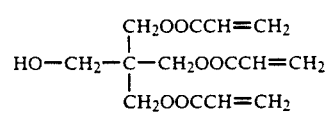

(iv) Tetra-acrylates

Pentaerythritol tetra-acrylate

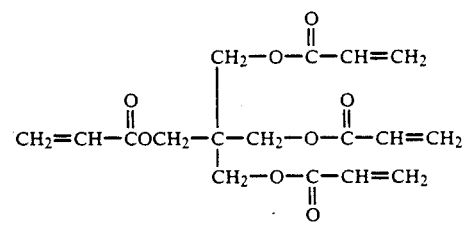

(v) Penta-acrylates

Dipentaerythritol (mono-hydroxy) penta-acrylate

-continued

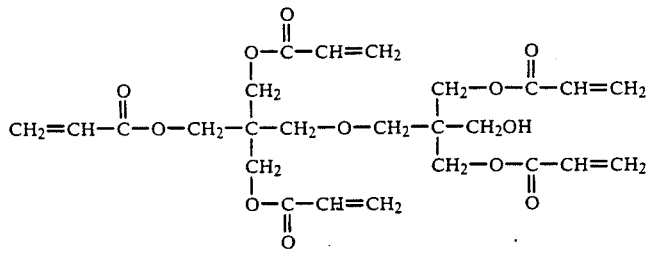

and (3) Allylic monomer e.g. Triallyl cyanurate

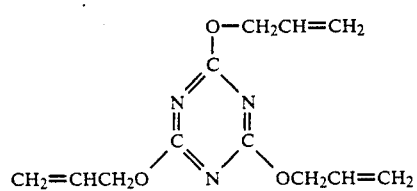

Trimethylol propane triallyl ether

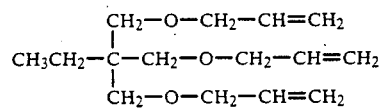

Benzophenone and its diaryl ketone derivatives possess the unifying feature of producing initiator radicals by intermolecular abstraction from an H-donor after irradiation with a U.V. light source. The H-abstraction step produces two radicals both of which are potential initiators of radical initiated polymerization. Tertiary amines with a-H-atoms react readily with the excited states of the ketones. H-transfer may be preceded by rapid formation of an excited state complex (exciplex) between the amine and excited ketone. Michler's ketone possesses both a diaryl ketone group and tertiary amine group. Combinations of Michler's ketone and benzophenone have been reported to exhibit a synergism when utilized in a U.V. curing of printing inks.

This synergism is believed to arise from higher absorptivity of Michler's ketone together with the greater reactivity of excited benzophenone.

In addition to the formation of an exciplex to enhance the photopolymerization rate, amines, such as small amounts of triethylamine, have other advantages in a benzophenone/acrylate system.

The $\alpha$-amino ($R_2C-NR_2$) radical, formed after the H-abstraction step, is generally much more effective than the relatively stable and bulky ketone radical. Besides, $\alpha$-amino radicals are electron-rich due to the resonance effect of the adjacent heteroatom and initiation is considered to be much more efficient with the electron-poor monomers, such as acrylates.

The addition of oxygen to growing polymers will form relatively less reactive peroxy radicals which will cause the radical-radical reactions, terminate the polymerization processes, and result in short chain lengths. This factor as well as oxygen quenching of triplet ketones is largely responsible for air inhibitors of surface-cure. However, these deleterious effects of oxygen are minimized by amine co-initiation since the $\alpha$-amino radicals can consume oxygen by a chain process such as:

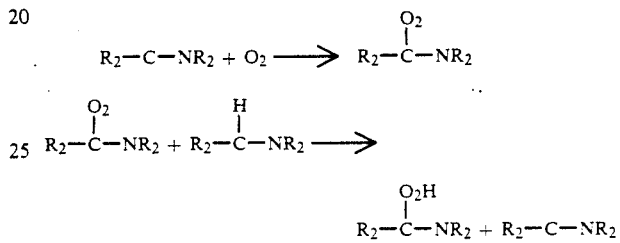

These features together make the combination of ketone/tertiary amine a particularly effective photoinitiator system for U.V. curing in air.

MECHANISMS

The following mechanisms are involved in the preceding reactions

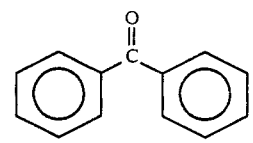

Benzophenone

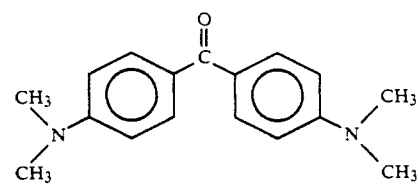

Michler's Ketone
4,4'bis(N,N'-dimethylamino)benzophenone

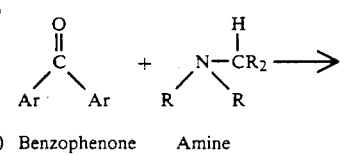

Benzophenone    Amine

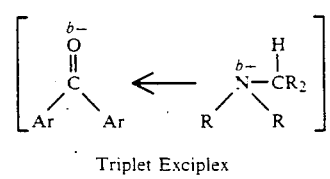

Triplet Exciplex

-continued

Exciplex $\xrightarrow{(a)}$ $\underset{Ar\ Ar}{\overset{O}{\underset{\|}{C}}}$ + $\underset{R\ \ R}{\overset{H}{\underset{|}{N}}{=}CR_2}$  Quenching ↑ (d)

Exciplex $\xrightarrow{(b)}$ $\underset{Ar\ Ar}{\overset{O^-}{\underset{\|}{C}}}$ + $\underset{R\ \ R}{\overset{H}{\underset{|}{N}}{-}CR_2}^+$  Electron-Transfer ↓ (e)

Exciplex $\xrightarrow{(c)}$ $\underset{Ar\ Ar}{\overset{OH}{\underset{|}{C}}}$ + $\underset{R\ \ R}{\overset{}{N}{=}CR_2}$  H-Transfer Initiation:

$Ph_2C{=}O \xrightarrow{h\nu} {}^1(Ph_2C{=}O)^*_{n-g^*} \longrightarrow$

Benzophenone ${}^3(Ph_2C{=}O)^*_{n-g^*} \xrightarrow{R_1H} Ph_2C{-}OH + R_1{'}$ $R_1{'} + M \longrightarrow P_1{'}$    where $P_1{'} = R_1(M)'$.

Propagation:

$P_n{'} + M \longrightarrow P_{(n+1)}$    where $P_{(n+1)} = P_n(M)'$

Termination:

$P_m{'} + P_n{'} \longrightarrow$ polymer $Ph_2C{-}OH + Ph_2C{-}OH \longrightarrow Ph_2\underset{|}{\overset{OH}{C}}{-}\underset{|}{\overset{OH}{C}}{-}Ph_2$ $Ph_2C{-}OH + P_n{'} \longrightarrow$ polymer As noted above, when an acrylate system, such as CP-100 is employed it is cured by photoinitiated free radical polymerization. The photoinitiator is usually an aromatic ketone with the concentration about 4-5%. Suitable photoinitiators include:

(1) Benzoin/Benzoin ethers $Ph{-}\overset{O}{\underset{\|}{C}}{-}\underset{\underset{OH}{|}}{\overset{H}{\underset{|}{C}}}{-}Ph$   (benzoin)

$Ph{-}\overset{O}{\underset{\|}{C}}{-}\underset{\underset{OR}{|}}{\overset{H}{\underset{|}{C}}}{-}Ph$   alkyl benzoin ether
R = butyl TRIGONAL 14 (Akzo Chemie America)

(2) Benzil Ketal $Ph{-}\overset{O}{\underset{\|}{C}}{-}\underset{\underset{OCH_3}{|}}{\overset{OCH_3}{\underset{|}{C}}}{-}Ph$   α,α-dimethoxy α-phenyl aceto phenone
IRGACURE 651 (Ciba Geigy)

(3) Acetophenone Derivatives $Ph{-}\overset{O}{\underset{\|}{C}}{-}\underset{\underset{OC_2H_5}{|}}{\overset{OC_2H_5}{\underset{|}{C}}}H$   α,α-diethoxy acetophenone

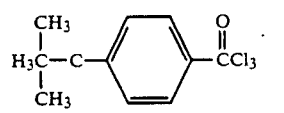

α,α,α-trichloro-4-t-butyl aceto phenone
TRIGONAL P1 (Akzo Chemica America)

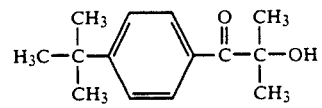

α,α-dimethylex-hydroxy 4-t-butyl acetophenone
DAROCUR 1116 (E. Merck)

$Ph{-}\overset{O}{\underset{\|}{C}}{-}\underset{\underset{CH_3}{|}}{\overset{CH_3}{\underset{|}{C}}}{-}OH$   α,α-dimethyl α-hydroxy acetophenone
DAROCUR 1173 (E. Merck)

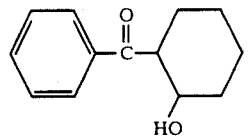

1-benzoyl cyclohexanol
INGACURE 184 (Ciba-Geigy)

(4) O-acylated-oximinoketones

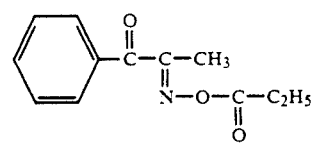

1-phenyl-1,2-propene-dione
2-O-ethoxycarbonyl ester
QUANTACURE PDO (Ward Blenkinsop)

(5) Aromatic ketone/Amine Combinations

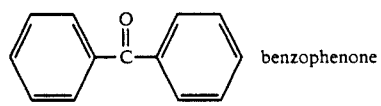 benzophenone

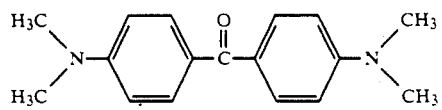

4,4'-dimethyl-amin-benzo phenone (Michler's Ketone)

-continued

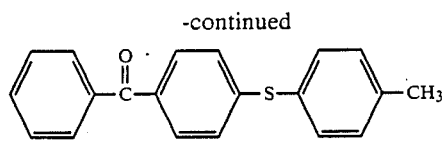

4-benzoyl-4'-methyl diphenyl sulfide
QUANTACURE BMS (Ward Blenkinsop)

(6) Thioxanthone and Derivatives

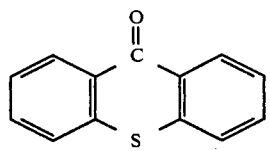

Thioxanthene

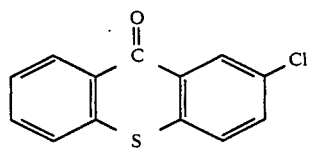

2-chlorothio xanthone

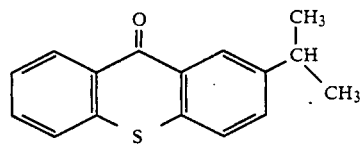

2-Isopropyl thioxanthone

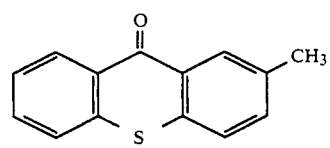

2-methyl thioxanthone

These are generally used in conjunction with one of the synergistic agents, such as:
ethyl-4-dimethylamino benzoate
ethyl-2-dimethyl amino benzoate
2-(n-butoxy) ethyl 4-dimethyl amino benzoate
2-(dimethylamino) ethyl benzoate
(7) Quinones

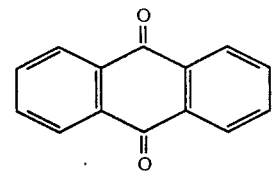

9,10-anthraquinone

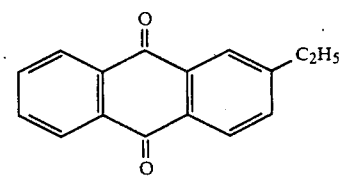

2-ethyl anthraquinone

-continued

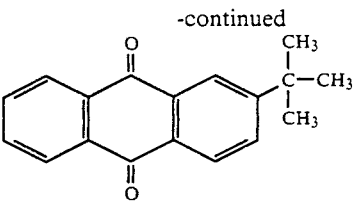

2-t.butyl anthraquinone (8) Organic Sulphur Compounds
e.g. diaryl disulphide
dibenzoyl disulphide
diacetyl disulphide
(9) Organic Phosphorus—containing compounds
e.g. Triphenyl phosphine
Triphenyl phosphite
Tri-orthotolyl phosphine
(10) Chlorosilanes
e.g. trimethyl chlorosilane
(11) Azo compounds
e.g azo-bis (isobutyronitrile)
diazirine The excited aromatic ketone after being irradiated with a U.V. source will get an H-atom from a monomer, solvent, or preferably a tertiary amine with an a-hydrogen. The H-transfer reactions between the aromatic ketones and the amines are usually very fast. The resulting α-amino radical can consume $O_2$ molecules through a chain process and regenerate the c-amino radicals. This process can assist surface curing, where the curing film contacts the air. The $O_2$ molecules are very effective quenchers for the radicals.

A small amount of Michler's ketone is also mixed into the formulation (about 1/10 of the concentration of benzophenone). Michler's ketone has both the aromatic ketone group and tertiary amine group in one molecule, and has strong absorption of light around 350 nm. Accordingly, it can effectively absorb the U.V. light from Hg-lamp and pass the energy to benzophenone to form excited benzophenone.

In the curing of a CP-100 system which is generally employed because the cure speed of the double bond in the acrylate group, the free radical generated from the photoinitiator will react with the unsaturated double bond in the polymer chain and then the other free radical is formed, which will react with the second unsaturated polymer chain to form the crosslinked thermosetting polymers.

Benzophenone exhibits absorption maxima in the ultraviolet spectra region at about 250 and 350 nm with e values of approximately 15,000 and 100 respectively. The e values represent a measure of the probability of light absorption at each wavelength. With benzophenone present in this first system, most of the 250 nm is absorbed at or near the surface, whereas the 350 nm light is available throughout the film for the through-cure. Michler's ketone, however, exhibits e values of about 15,000 and 40,000 at 250 nm and 350 nm respectively. The combination of Michler's ketone and benzophenone shows some kind of synergism, probably because of the higher absorptivity of Michler's ketone and the greater reactivity of triplet benzophenone.

The free radicals generated from the photoinitiation step or the propagation process are very reactive. They will be quenched effectively by $O_2$ molecules, recombine with other radicals nearby, or undergo $O_2$ addition and terminate the propagation. In general, as soon as exposure to the U.V. source is terminated the polymerization processes stop. There is an optimal concentration of photoinitiator which is governed by efficient U.V. light utilization and initiator radical formation as opposed to self-quenching and light U.V. screening by the photoinitiator.

Most acrylic functional resins are extremely viscous due to the urethane or epoxy backbones. Among these it has been found that epoxy resin has good adhesion, a high level of chemical resistance, non-yellowing colors and flexibility. Polyesters and polyethers have lower viscosities. The polymerizable resins can provide the final film hardness and chemical resistance. The reactive monomers, or the unreactive plasticizers, are often introduced to modify its flow properties and reduce the final film brittleness. Reactive monomers can be used not just as rheological (viscosity and tack) control agents but also as crosslinking agents.

A peculiar effect has been discovered which is significant in the actual packing of the spheres, whether the pulsing mode of this first system is employed or whether the magnetic field of the second system is used to effect ink film shrinkage.

Figure 3:
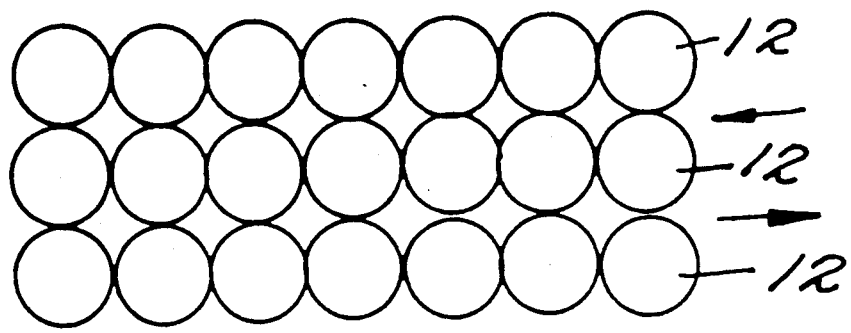
FIG. 3 is a schematic view illustrating the packing of identical spheres whereby adjacent layers thereof are capable of slipping past one another.
Figure 4:
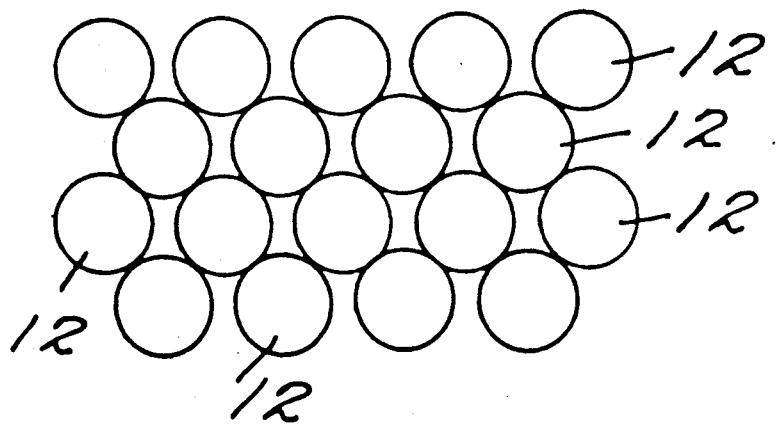
FIG. 4 is a schematic view illustrating the packing of identical spheres whereby adjacent layers thereof are not capable of slipping past one another.
Figure 5:
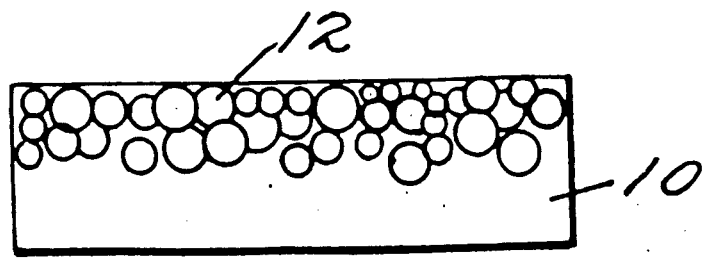
FIG. 5 is a schematic view illustrating the present invention wherein spheres vary in diameter by at least plus or minus 15 microns thereby permitting additional packing without undue reduction in fluidity yet providing high conductivity.

The closest packing of identical spheres 12 with the resin 10 filling the interstices is a completely hexagonal array with all spheres in contact. This array however has no fluidity because adjacent layers cannot slide past one another. See FIG. 4. If, however, one considers a set of planar arrays of spheres 12, each of which has hexagonal packing, but now each sphere 12 rests in registry with the one below it rather than nesting in a space defined by three spheres 12 of the adjacent layer, it is now possible for slippage to take place. See FIG. 3. If all the spheres 12 are of equal diameter, it is only possible for the spheres 12 to occupy a volume fraction of slightly more than 60 percent which yields insufficient electrical conductivity. However, if the spheres 12 vary in diameter by at least plus or minus 15 microns, increased packing without undue reduction of fluidity is achieved. See FIG. 5.

GENERAL DESCRIPTION OF THE SECOND SYSTEM

The inventor has also discovered that when a U.V. curable ink comprising a suspension of silver-coated magnetite particles in a U.V. curable resin is employed and a circuit pattern printed with this U.V. curable ink composition is subjected to a magnetic field of an intensity sufficient to move the magnetite particles to a position at or near the upper surface of the resin, i.e., the surface remote from that juxtaposed to the circuit board substrate on which the circuit pattern is printed, without breaking the surface tension thereof or substantially increasing the thickness of the ink film, and effecting U.V. radiation cure of the U.V. curable ink, an ideal printed circuit board is achieved.

This second system, as does the previously described first system, causes the magnetite particles to move into closer contact with one another, thus resulting in the patterned conductive circuit elements or trace being capable of carrying a greater operating current as well as exhibiting a lower resistance and being solderable.

Polymer thick film and "additive" printed circuit board technology appear destined to grow at a rapid rate. The impetus for this growth is due to several reasons, amongst which are (a) the development of a directly solderable conductor which is one of the primary benefits achieved by the present invention, and especially the implementation of the inventor's second system, which eliminates the need of plating, and (b) the increasing use of surface-mount technology since the capability of fabricating structures using polymer thick technology and surface mount technology make a very attractive combination in terms of size and cost when compared to multilayer printed circuit boards with a multitude of plated through holes.

Any resin may be employed which is U.V. curable, including: cycloaliphatic epoxides which are commercially available as UVR-6100 and UVR-6110 from Union-Carbide Corporation and CY-179 from Ciba-Geigy Corporation, where UVR-6110 and CY-179 are 3,4-epoxycyclohexylmethyl-3,4-epoxycylohexane carboxylate having the following structural formula:

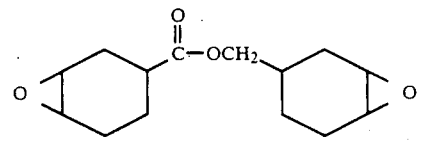

Novolak epoxy resins, including those derived from ortho-cresol formaldehyde novolac and epichlorohydrin

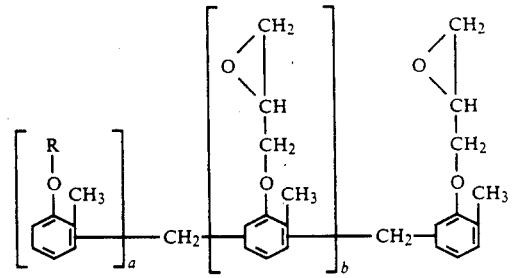

which is commercially available as ECN-1235 from Ciba-Geigy Corporation and

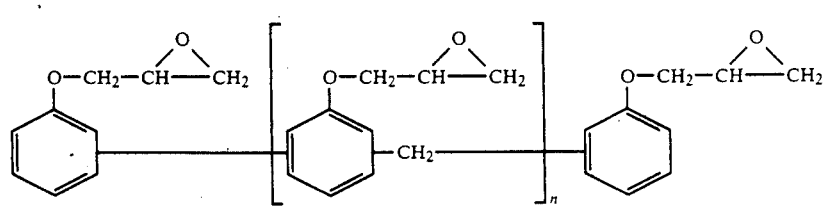

which is commercially available as D.E.N. 438 from the Dow Chemical Company; diglycidyl ethers of bisphenol A (DGEBA)

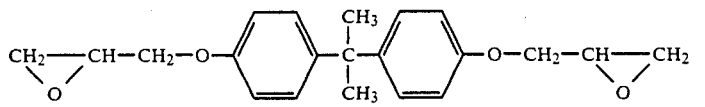

commercially available as ARALDITE GY 6010 from Ciba-Geigy Corporation, D.E.R. 331 from The Dow Chemical Company, EPI-REZ 510 from Interez, Inc., and EPON 828 from Shell Chemical Company; diacrylate ester of Bisphenol A type epoxy resins

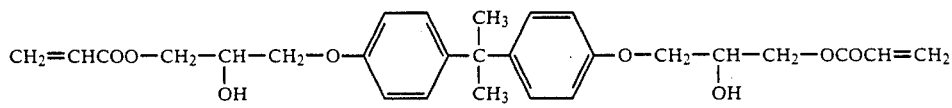

commercially available as Novacure 3700 from Interez;,

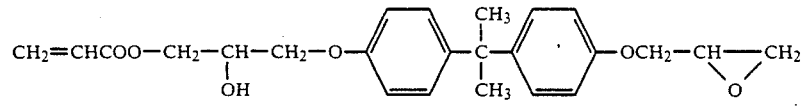

Inc.; partially acrylated bisphenol A type epoxy resins,

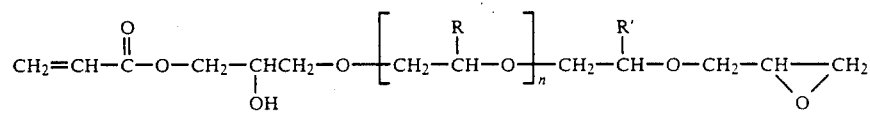

commercially available as RDX 52197 from Interez,

Inc.; polyglycol diepoxides

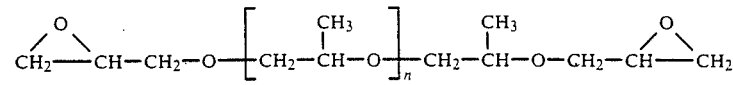

commercially available as D.E.R. 736 from The Dow Chemical Company; diacrylated ester of a polyglycol type epoxy resin

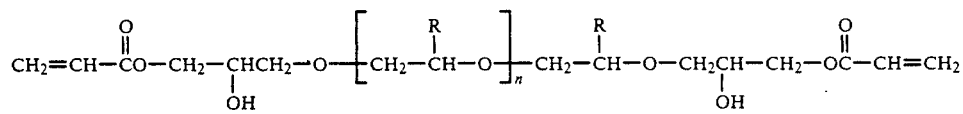

partially acrylated ester of polyglycol type epoxy resin

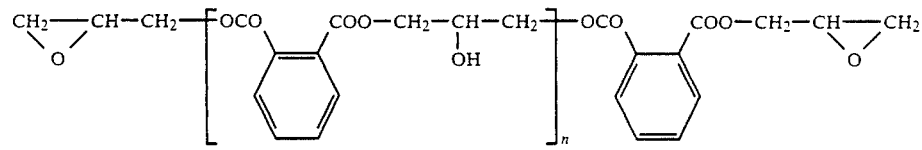

diglycidyl ethers of phthalic acid esters such as Syodyne-508 commercially available from Showa Denco; diacrylate ester of phthalic acid type epoxy resins

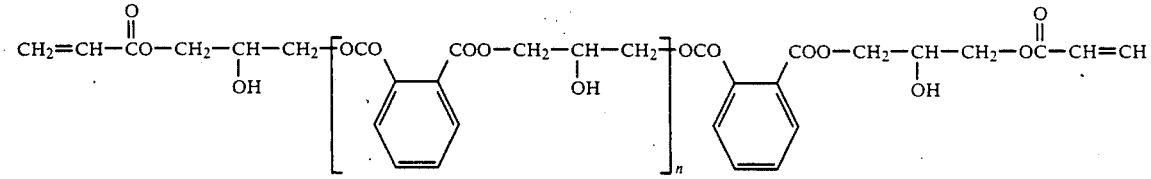

and partially acrylated phthalic acid type epoxy resins.

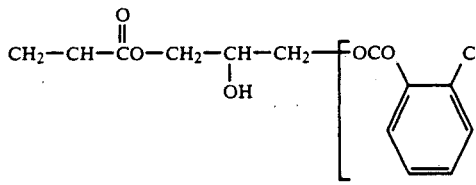

In one embodiment of this second system, the U.V. curable ink compositions utilize as the polymeric matrix or binder a cycloaliphatic epoxide that can be cured in seconds with photoinitiators to a hard durable condition.

Modifiers can be included in the composition to improve flexibility and adhesion. Suitable flexibilizers include epoxide flexibilizers, commercially available as CYRACURE UVR 6351 and CYRACURE UVR 6379 from Union Carbide Corporation, caprolactone-based multifunctional polyols which are available as TONE Polyols from Union Carbide Corporation and a polytetramethylene oxide glycol available commercially as POLYMEG 2000 from QO Chemicals.

It may be desirable to include flow control agents or surfactants, examples of which include polyalkylene oxide modified dimethylpolysiloxanes

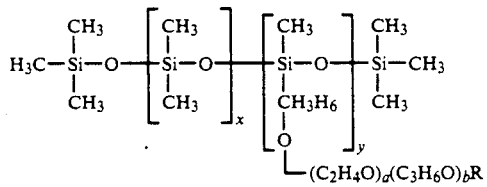

commercially available s SILWET L-7604 from Union Carbide Corporation and a fluorinated allyl alkoxylate available as FLUORAD FC-430 and FC-171 from 3M Company.

Fillers and other additives may be added. For example, to increase the viscosity, it may be desirable to use inert polymers of cellulosics such as cellulose acetate butyrate and ethyl cellulose, polycaprolactone and vinyl chloride/vinyl acetate copolymers; or silicas, such as anhydrous aluminum silicates commercially available as Optiwhite from Burgess Pigment Company and zirconium silicates commercially available as EX-CELOPAX from NL Industries, Inc. To improve hardness, crystalline quartz, such as MINUSIL 15 available from PPG Industries, Inc., may be added.

Diluents may also be added and include CYRACURE UVR-6200 commercially available from Union Carbide Corporation, glycidyl acrylate,

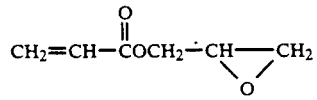

and glycidyl methacrylate

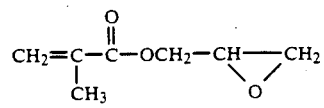

both available from Aldrich Chemical Company, 3,4-epoxycyclohexymethyl acrylate

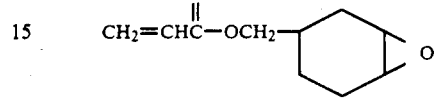

3,4-epoxycyclohexylmethyl methacrylate

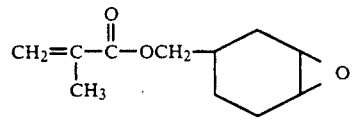

aliphatic triglycidyl ether available as EPI-REZ-5048 from Interez, Inc. and ARALDITE RD-2 from Ciba-Geigy Corporation.

It is important to note that again one significant feature of this second system is the ability to separate the polymeric binder from the conductive particles via magnetic levitation of the silver-coated magnetite particles. The cycloaliphatic epoxide can be cured in seconds with an appropriate photoinitiator and U.V. light source.

The photoinitiators dissociate under the influence of U.V. radiation to form cationic species that rapidly polymerizes the cycloaliphatic epoxides. Unlike U.V. resins that are based on free radical chain reactions, cationic homopolymerization has few, if any, terminating reactions. The propagation ends remain intact to form a "living" polymer; thus polymerization continues after U.V. exposure (even under surface mount technology conditions).

Suitable photoinitiators for the U.V. curing of the cycloaliphatic epoxide are the various onimum salts that undergo photodecomposition to yield a cationic species for initiation and propagation of the polymerization. Photogenerated HPF6 is a strong protonic acid that can initiate the cationic polymerization. Other suitable photoinitators include aryldiazonium compounds having the following formula

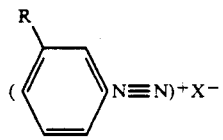

where $X^- = BF_4^-$, $PF_6^-$, $AsF_6$, $SbF_6^-$, $FeCl_4^-$, or $SbCl_6^-$; diaryliodonium compounds

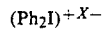

where $X^- = BF_4^-$, $PF_6^-$, $AsF_6^-$, or $SbF_6^-$; triarylsulphonium compounds $(Ph_3S)^+X^-$ commercially available as CYRACURE UVI-6974 and CYRACURE UVI-6990 from Union Carbide Corporation, UVE-1014 and UVE-1016 from General Electric Co. and FX 512 from 3M Company; and triarylsilenonium compounds $(PhSe)^+X^-$, where in both triaryl compounds, $X^- = BF_4^-$, $PF^-$, $A3F_6^-$ or $SbF_6^-$.

Preferably, the cylcoaliphatic epoxides employed in the present invention are those which are commercially available such as UVE-1014 sold by General Electric, FC-508 sold by 3M, and CP-101 manufactured by Key-Tech, with UVE-1014 being preferred. CP-101 is a multipurpose cycloaliphatic epoxide monomer having excellent response to cure with photoinitiators. As the major component, CP-101 provides good adhesion and to avoid any brittleness that might be encountered with the use of CP-101; it polyol plasticizer, such as POLY-MEG 2000. This particular plasticizer actually enters into the polymerization as shown by the following reaction scheme:

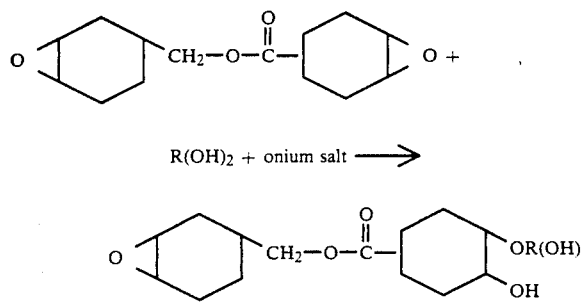

It is believed that the curing mechanism involving a U.V. curable epoxy resin having a typical formulation below, is as follows

| Typical Formulation | | Function |
|---|---|---|
| Monomer | Cycloaliphatic Epoxide | Film-forming materials |
| Modifier | polyether polyol | React with basic materials |
| | | Make coating flexible |
| Photoinitiator | Cationic Type | Light sensitive chemical |
| Surfactant | Fluorinated Chemical | Wetting agent for non-porous substrates |

In the photoinitiation stage, several inorganic and anometallic salts are active photoinitiators of the cationic polymerization. A triarylsulfonium compound almost approaches an ideal for photoinitiators. This class of compounds possesses the favorable properties of neither undergoing air inhibition, nor being temperature sensitive or affected by other radical inhibitors. The photo-reactivity is not quenched by triplet-state quenchers and is not accelerated by radical photoinitiators. The photochemical mechanism is similar to that of another class of compounds, i.e., diaryliodonium salts, but triarylsulfonium salts have greater thermal stability. These salts have the general structure $Ar_3S^+ MX_n^-$ where $MX_n^-$ is a complex metal halide, $BF_4^-$, $PF_6^-$, $AsF_6^-$ or $SbF_6^-$. The reactivity of salts is found to increase with the size of the counter anion, namely, $BF_4^- << PF_6^- < AsF_6^- < SbF_6^-$.

Upon irradiation by the U.V. source having a wavelength below 350 nm, the sulfonium cation undergoes homolytic cleavage with the anion remaining unchanged.

$$Ar_3S^+MX_n^- \xrightarrow{h\nu} [Ar_3S^+MX_n^-]^*$$

$$[Ar_3S^+MX_n^-]^* \longrightarrow Ar_2S^{+\cdot} + Ar\cdot + X^-$$

$$Ar_2S^{+\cdot} + Y^- \longrightarrow Ar_2S^+{-}H + Y\cdot$$

$$Ar_2S^{+-}H \longrightarrow Ar_2S + H^+$$

wherein Y—H represents a monomer or solvent.

The overall photolysis reaction is $$Ar_3S + MX_n{-} + Y{-}H \; Ar_2S + Ar\cdot + Y + HMX_n$$

A strong Bronsted acid for cationic curing such as HBF4, HPF6, or HSbF6 is formed. The rate of photolysis of triphenylsulfonium salts is linear with respect to the light intensity.

Using triphenylsulfonium salt photoinitiators, it has been found possible to polymerize virtually any cationically polymerizable monomer. This includes olefins, dienes, epoxides, cyclic ethers, sulfides, acetals, and lactones. Epoxy compounds and resins are of particular interest as a class of polymerizable materials in U.V. curing. In general, these materials are readily available as commodity items, and the resulting cured polymers possess excellent dimensional and thermal stability as well as superior mechanical strength and chemical resistance.

Especially preferred epoxides for use in the present invention are the cycloaliphatic and diglycidyl ether of bisphenol A(DBEGA) types. Cycloaliphatic epoxides give faster cure response and are lower in viscosity, although they may not be as economical as DGEBA epoxides. However, both types of epoxides provide toughness, hardness and chemical resistance.

Useful polyol plasticizers, which can contain either polyether or polyester backbones, are usually mixed into the formulation to make the coating more flexible. Polyester polyols give a faster cure response and are useful at higher levels to give excellent coating flexibility. Polyether polyols produce lower viscosity coatings and maintain greater hydrolytic resistance to cured films. This latter type of polyol is not a typical plasticizer since it actually enters into the polymerization.

As indicated above, unlike U.V. coatings based on free radical chain reactions, cationic polymerization has few terminating reactions. The propagating ends remain intact to form a "living" polymer; thus, polymerization continues after U.V. exposure, i.e., under dark conditions. Immediately after irradiation at room temperature the resin, depending on light intensity, photoinitiator concentration, and temperature, may show some tack or may not be fully solvent resistant. In general, the full chemical and physical properties of the resin does not develop for about 24 hours. This "post cure" can be markedly accelerated by raising the temperature. Similar properties of the cured films have been reached by warming the films at 71 C for 2-4 hours.

In the curing of an epoxide system, the mechanism can involve the following specific type reaction scheme:

(a) Photolysis reaction of photoinitiators

(b)

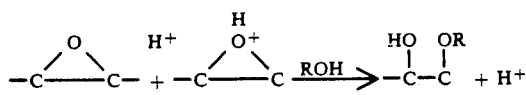

Incorporation of polyols into the polymer

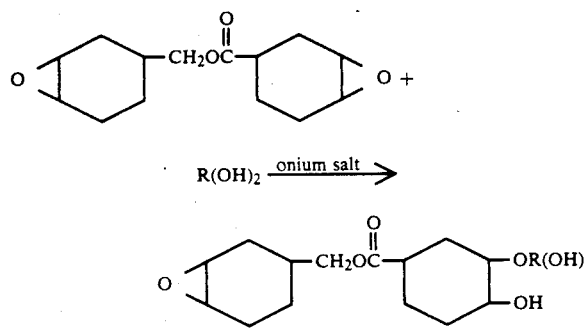

(d) Propagation of polymer

HPF$_6$ + M(UVR-6110)     HM+PF$_6^-$ - initiation
HM+PF$_6$ + nM     H(M)$_n$ M+PF$_6^-$ - propagation On exposure to actinic sources, the photoinitiator of a U.V.-curing epoxide system will form a strong Bronsted acid or a Lewis acid, which will protonate the epoxide ring and make it readily accessible for a nucleophilic attack. The nucleophile in this system is a hydroxyl group from the polyol stabilizer or a monomer. This reaction will make an a-alkoxy and a free proton. The proton will protonate the other epoxide ring to propagate the polymerization and the hydroxyl group (alcohol) will attack protonated rings to form crosslinked polymers. The photocationic systems have several advantages.

(1) They can be used to cure saturated monomers such as epoxy resins. The advantage of curing saturated epoxides over the unsaturated types is that the former have only a small volatility, good flow, no significant color, negligible toxicity and superb physical and chemical properties;

(2) cationic photopolymerization is insensitive to aerobic conditions, and inert blanketing required for some free radical polymerizations is not needed; and (3) on removal of actinic radiation, these systems continue to polymerize thermally.

However, it has been found that post cure is usually required and that basic materials will neutralize the acids and should not be mixed into the system.

In order to establish a useful magnetic source strength, the movement of one silver-coated magnetite sphere in resins of varying densities has been calculated (see Tables IA-IVA). The material employed was the result of printing sample circuit patterns or traces on a 0.005" polyester film anchored in a holding jig which was placed in proximity to the magnet plane. This holding jig or device was attached to a micrometer ball slide which allowed precise adjustability with respect to the position of the printed polyester sheet and the magnet. The data set forth in Table III establishes the operational parameters for correct base to pole distance, time interval in magnetic field, resin viscosity, magnetic source strength and volume percentage of magnetite spheres in the resin.

TABLE IA

| | mks | Rise time Symbol | cgs-equivalent |
|---|---|---|---|
| Sphere | | | |
| Diameter | m | 2a   3.70E − 03 | 0.0037 cm |
| Volume | m$^3$ | V   1.59E − 13 | |
| Density | Kg/m$^3$ | ds   3.10E + 03 | 3.10 g/cc |
| Mass | Kg | m   4.93E − 10 | |
| Weight | N | sw   4.83E − 09 | |
| Resin | | | |
| Viscosity | Kg/sm | eta   5.00E + 04 | 5000 c poise |
| Thickness | m | R   1.78E − 05 | 0.0007 in |
| Width | m | wd   1.27E − 03 | 0.05 in |
| Density | Kg/m$^3$ | dr   2.50E + 03 | 2.5 g/cc |
| Eff. of sphere | N | rw - 9.55E − 11 | |
| Buoyant accel. | M/S$^2$ | W   1.09E + 00 | |
| Substrate | Thickness m | S | 0.002 |
| Magnetic Field Parameters | | | |
| Source Strength | Vs/m$^2$ | Q   0.05 | 500 gauss |
| Base-to-pole distance | m | D   0.003 | 0.3 cm |
| Permeability of spheres | | 1.69E + 00 | |

TABLE IIA

| | Magnetization of Ferrite Sphere | | |
|---|---|---|---|
| B. Gauss | M emu | ! Avg. | B Vs/m$^2$ |
| 0 | 0 | | 0 |
| 100 | 4.9 | 1.616 | 0.0100 |
| 200 | 12.3 | 1.773 | 0.0200 |
| 350 | 20.4 | 1.732 | 0.0350 |
| 500 | 28.4 | 1.714 | 0.0500 |
| 650 | 35.7 | 1.690 | 0.0650 |
| 800 | 42.0 | 1.672 | 0.0800 |
| 950 | 49.2 | 1.651 | 0.0950 |
| 1044 | 55.0 | 1.662 | 1.689   0.1044 |
| 2045 | 76.3 | 1.469 | 0.2045 |
| 3062 | 81.2 | 1.333 | 0.3062 |
| 4067 | 82.7 | 1.256 | 0.4067 |
| 8079 | 84.3 | 1.131 | 0.0879 |
| 11943 | 84.5 | 1.089 | 1.1943 |

TABLE III A

Calculation of Rise (Fall) Time For Magnetic-Field-Free Conditions

| Terminal Velocity in resin | 2.77E − 10 m/s | m/s |
|---|---|---|
| t-zero | 2.83E − 11 | s |
| Settling time | 6.41E + 04 | s |

TABLE IVA

CALCULATION OF THE RISE-TIME WITH AN APPLIED MAGNETIC FIELD

| Delta-t. s | | | | | Constant 3.75E − 08 | | |
|---|---|---|---|---|---|---|---|
| time in units of delta-t | 0.0005 x m | s velocity m/s | B(x) Vs/sq · m | grad B Vs/cu · m | Acceleration components in m/s 2 | | |
| | | | | | viscous | magnetic | gravity |
| 0 | 2.000E − 03 | 0.00E + 00 | 2.60E − 01 | 4.00E + 00 | 0.00E + 00 | 3.90E − 08 | 4.83E − 09 |

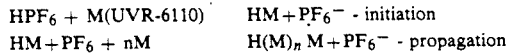

TABLE IVA-continued

CALCULATION OF THE RISE-TIME WITH AN APPLIED MAGNETIC FIELD

| | | | | | | | |
|---|---|---|---|---|---|---|---|
| 1  | 2.000E − 03 | 2.19E − 11 | 2.60E − 01 | 4.00E + 00 | −3.82E − 10 | 1.04E + 00 | 4.83E − 09 |
| 2  | 2.000E − 03 | 5.20E − 04 | 2.60E − 01 | 4.00E + 00 | −9.07E − 03 | 1.04E + 00 | 4.83E − 09 |
| 3  | 2.001E − 03 | 1.04E − 03 | 2.60E − 01 | 4.00E + 00 | −1.81E − 02 | 1.04E + 00 | 4.83E − 09 |
| 4  | 2.001E − 03 | 1.55E − 03 | 2.60E − 01 | 4.01E + 00 | −2.70E − 02 | 1.04E + 00 | 4.83E − 09 |
| 5  | 2.002E − 03 | 2.06E − 03 | 2.61E − 01 | 4.01E + 00 | −3.58E − 02 | 1.05E + 00 | 4.83E − 09 |
| 6  | 2.003E − 03 | 2.56E − 03 | 2.61E − 01 | 4.02E + 00 | −4.46E − 02 | 1.05E + 00 | 4.83E − 09 |
| 7  | 2.005E − 03 | 3.06E − 03 | 2.61E − 01 | 4.02E + 00 | −5.34E − 02 | 1.05E + 00 | 4.83E − 09 |
| 8  | 2.006E − 03 | 3.56E − 03 | 2.62E − 01 | 4.03E + 00 | −6.21E − 02 | 1.06E + 00 | 4.83E − 09 |
| 9  | 2.008E − 03 | 4.06E − 03 | 2.62E − 01 | 4.04E + 00 | −7.07E − 02 | 1.07E + 00 | 4.83E − 09 |
| 10 | 2.010E − 03 | 4.55E − 03 | 2.63E − 01 | 4.05E + 00 | −7.94E − 02 | 1.07E + 00 | 4.83E − 09 |
| 11 | 2.013E − 03 | 5.05E − 03 | 2.64E − 01 | 4.07E + 00 | −8.80E − 02 | 1.08E + 00 | 4.83E − 09 |
| 12 | 2.015E − 03 | 5.54E − 03 | 2.65E − 01 | 4.08E + 00 | −9.66E − 02 | 1.09E + 00 | 4.83E − 09 |
| 13 | 2.018E − 03 | NA | 2.65E − 01 | 4.10E + 00 | NA | NA | 4.83E − 09 |
| 14 | NA | NA | NA | NA | NA | NA | 4.83E − 09 |
| 15 | NA | NA | NA | NA | NA | NA | 4.83E − 09 |
| 16 | NA | NA | NA | NA | NA | NA | 4.83E − 09 |
| 17 | NA | NA | NA | NA | NA | NA | 4.83E − 09 |
| 18 | NA | NA | NA | NA | NA | NA | 4.83E − 09 |
| 19 | NA | NA | NA | NA | NA | NA | 4.83E − 09 |
| 20 | NA | NA | NA | NA | NA | NA | 4.83E − 09 |
| 21 | NA | NA | NA | NA | NA | NA | 4.83E − 09 |
| 22 | NA | NA | NA | NA | NA | NA | 4.83E − 09 |
| 23 | NA | NA | NA | NA | NA | NA | 4.83E − 09 |
| 24 | NA | NA | NA | NA | NA | NA | 4.83E − 09 |
| 25 | NA | NA | NA | NA | NA | NA | 4.83E − 09 |
| 26 | NA | NA | NA | NA | NA | NA | 4.83E − 09 |
| 27 | NA | NA | NA | NA | NA | NA | 4.83E − 09 |
| 28 | NA | NA | NA | NA | NA | NA | 4.83E − 09 |
| 29 | NA | NA | NA | NA | NA | NA | 4.83E − 09 |

| Delta-t. s time in units of delta-t | DELTA-V m/s | delta-x m | total delta-x m |
|---|---|---|---|
| 0  | 2.19E − 11 | 1.10E − 14 | 1.10E − 14 |
| 1  | 5.20E − 04 | 1.30E − 07 | 1.30E − 07 |
| 2  | 5.16E.04   | 3.89E − 07 | 5.19E − 07 |
| 3  | 5.12E − 04 | 6.46E − 07 | 1.16E − 06 |
| 4  | 5.08E − 04 | 9.01E − 07 | 2.07E − 06 |
| 5  | 5.05E − 04 | 1.15E − 06 | 3.22E − 06 |
| 6  | 5.02E − 04 | 1.41E − 06 | 4.62E − 06 |
| 7  | 4.99E − 09 | 1.66E − 06 | 6.28E − 06 |
| 8  | 4.97E − 04 | 1.90E − 06 | 8.18E − 06 |
| 9  | 4.95E − 04 | 2.15E − 06 | 1.03E − 05 |
| 10 | 4.93E − 04 | 2.40E − 06 | 1.27E − 05 |
| 11 | 4.92E − 04 | 2.65E − 06 | 1.54E − 05 |
| 12 | 4.91E − 04 | 2.89E − 06 | 1.83E − 05 |
| 13 | NA | NA | NA |
| 14 | NA | NA | NA |
| 15 | NA | NA | NA |
| 16 | NA | NA | NA |
| 17 | NA | NA | NA |
| 18 | NA | NA | NA |
| 19 | NA | NA | NA |
| 20 | NA | NA | NA |
| 21 | NA | NA | NA |
| 22 | NA | NA | NA |
| 23 | NA | NA | NA |
| 24 | NA | NA | NA |
| 25 | NA | NA | NA |
| 26 | NA | NA | NA |
| 27 | NA | NA | NA |
| 28 | NA | NA | NA |
| 29 | NA | NA | NA |

Depending upon the conductivity levels required the U.V. curable ink composition comprises 25 to 67 volume percentage of silver-coated magnetite spheres to the resin employed. This volume percentage can vary depending upon the electrical characteristics required in the circuit design. Thus, the U.V. curable ink composition provides great flexibility of loading which lends it to many printing or application techniques including screen printing, gravure printing, spraying or nozzle distribution.

In some situations, it has been found desirable to combine free radical and cationic polymerization in the same U.V. curable ink compositions. Sulfonium salt is capable of initiating both free radical and cationic polymerization, and therefore, simultaneous polymerization of acrylates and epoxides.

Figure 6:
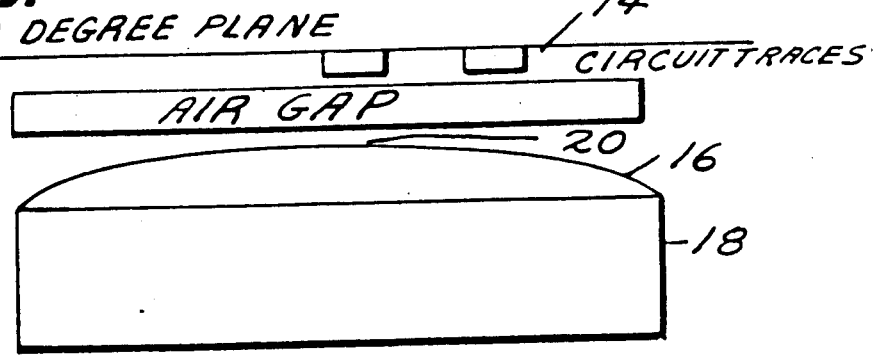
FIG. 6 is a schematic of one embodiment of the magnetic device of the present invention.

As shown in FIG. 6 immediately after printing the circuit trace on the substrate, the resulting circuit traces 14 on the circuit board are placed trace side down to the face 16 of the magnet 18. The preferred distance from the highest point on the printed circuit trace to the magnet face is 0.008 inch, and this is measured from the center 20 of the magnet face 16. This is particularly important when the magnet employed has a spherically formed face so as to insure correct field strength across the circuit trace. Dwell time, or exposure of the circuit trace to the magnetic field can vary depending on the viscosity of the resin matrix or binder. However, it has been found that using a resin having a viscosity of 20,000 centipoises, a dwell or exposure period of 3 seconds is sufficient to compact the magnetite spheres at the upper level thereof in such a way to increase the conductivity thereof to the desired levels.

The next step is to expose the circuit board to a U.V. source of 380 nm for a period of 8 seconds. While it is possible to cure the resin in as short a period as 3 seconds, it is imperative that complete polymerization throughout the ink film thickness is achieved. In some situations, it maybe desirable to irradiate the circuit board from both the top and bottom thereof due to the actual protrusion of the spheres through the ink film thickness. This not only ensures complete polymerization but it also causes some of the resin to shrink away from the highest point of the spheres, thus, enhancing the solderability of the trace.

In a preferred embodiment of this second system, a samarium cobalt magnet 18 ia employed which has the following properties:

| Peak energy density - (BdHd) max X10-6 | 24.0 |
|---|---|
| Residual Induction - Gauss | 10200 |
| Coercive force - Oersteds | 9200 |
| Saturation Magnetizing Force - Oersteds | >20,000 |

Where larger circuits are to be exposed to magnetic levitation, it is preferred to use a samarian cobalt magnet due to its greater peak energy density which is in the range of 20.0 to 28.0. It is important that when the magnet face is ground with abrasive wheels or the like that liberal amounts of coolant are employed to minimize heat cracking and chipping which have an adverse effect on the uniformity of the magnetic field to which the circuit trace is exposed.

Figure 8:
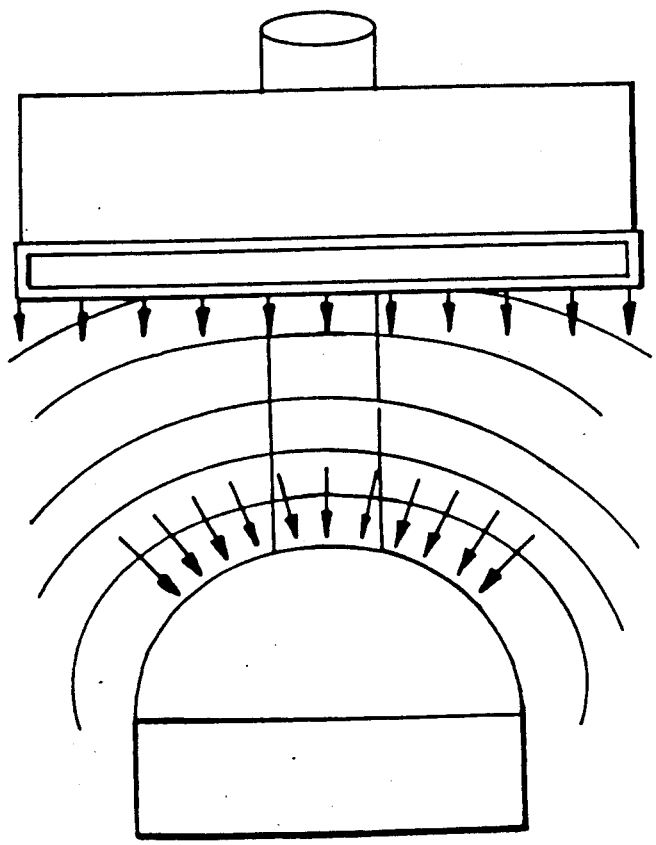
FIG. 8 is side view of the magnetic device of FIG. 7.
Figure 7:
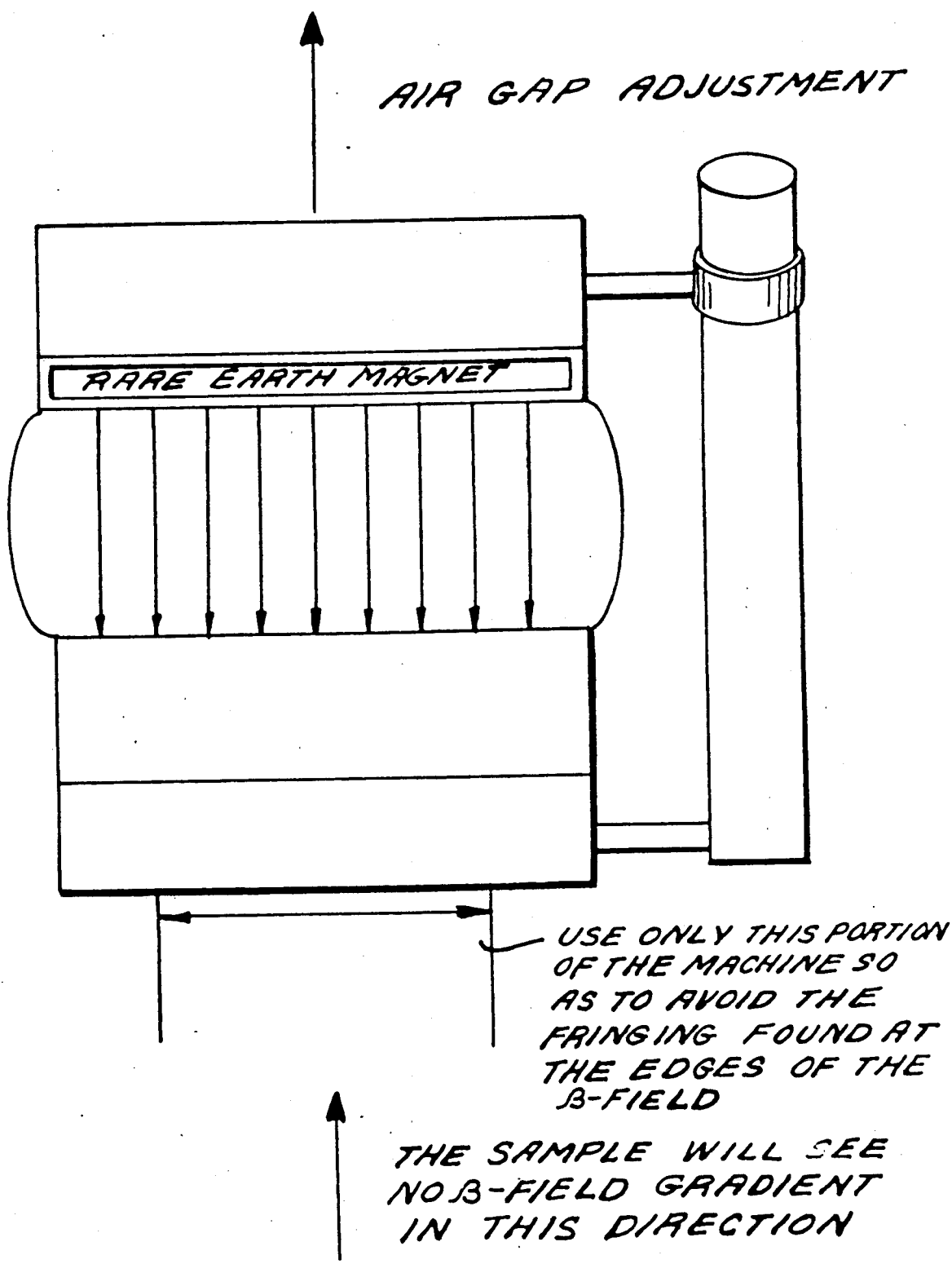
FIG. 7 is a frontal schematic of another embodiment of a magnetic device of the present invention.

Another embodiment of the magnetic device employed in the present invention is shown in FIGS. 7 and 8.

The magnetic field to be used for levitating the spheres must not be a uniform field. This is the reason for the polepiece 22 being added versus a curved magnet 18 previously described. In this alternative device, there must be a strong gradient of the field, in order that the upward force on one of the induced poles exceed the downward force on the other, otherwise there will be no tendency for the spheres to rise in the ink film thickness.

Using this alternate device, it is much easier to homogenize the flat magnet in order to achieve uniform peak field density and use the yoke design with a cold roll steel polepiece to create a certain area of non-uniformity.

This alternate design provides the necessary field gradient since the levitating field is constructed in a configuration that provides a uniform value of the gradient of the vertical magnetic field along one horizontal direction and passes the material to be levitated horizontally through it in a direction perpendicular to the first. Thus, the necessary gradient is established by supporting the rare-earth magnet above the path of the circuit while providing a steel polepiece underneath that path to guide the field lines into the return part of the magnetic field. This will subject the spheres to a lifting force as they enter and again as they leave the region of the magnetic field.

A vertical gradient in the magnetic field necessarily is accompanied by a horizontal gradient; however, this alternate device minimizes this condition by configuring the field such that the horizontal gradient is in the direction of motion of the substrate. There will be some horizontal displacement of the spheres, but being first forward and then backward along the line of travel, it does not adversely affect the final resolution.

The maximum remanent magnetism of the magnetite spheres is 1.5 emu/gm. This compares with the minimum value of the saturation magnetization of 81 emu/gm. This means that there will be very little residual magnetization in the cured conductive trace and will have no effect on the ability of the cured trace to conduct an electric current.

In both the first and second systems described above, adhesion of the printed circuit trace or pattern is governed by the U.V. curable ink composition and substrate interactions.

Adequate wetting by close contact of the U.V. curable ink composition with the substrate is essential for the attainment of satisfactory adhesion. Substrate/ink composition interactions can be both chemical and physical in nature. Either ions or covalent bonding between the ink composition and substrate can evolve powerful adhesion forces. However, owing to the transient time gap and relatively low temperature, covalent bonding forces are not easy to create for photopolymerizable systems.

Generally speaking, adhesion is not a problem for the curing on porous substrates such as paper and plastics.

Compared to free-radical polymerization, cationic photopolymerization does show some advantages on adhesion:

(i) Ionic bonds between the ink composition and the substrate are more likely formed.

(ii) After curing, the saturated epoxide system will have less shrinkage than the polymer cured from unsaturated compounds. Sometimes these shrinkage stresses in a high-density crosslinked ink composition are strong enough to tear the coating off the substrate.

Ink compositions for non-porous substrates such steel and copper will require the addition of a wetting agent.

In case adhesion is a problem, post-bake may be required to anneal the film while cooling, thereby relaxing the residual cure stress.

The present invention also relates to a composition for use in shielding enclosures housing electronic equipment and to the enclosure provided with this shielding composition.

Prior to 1975 most enclosures for business machines were constructed of metallic materials, such as die cast zinc or aluminum or sheet metal aluminum or steel. In the mid-1970's, plastics processors developed as a potential challenger to the metal enclosures a structural foam molded cabinet using some of the newer engineering resins. The structural foam process was developed by Union Carbide in the 1960's, and by the mid-1970's, the technology had been developed to the point where foamed units could offer comparable strength and lighter weight to cold rolled steel. By the early 1980's, the continued miniaturization of electronic components reduced many of the enclosures to a size where straight injection molded units could be used instead of metal or structural foam.

Further, the conversion from metal to plastic enclosures is of direct concern to the EPA because it is certain to increase the incidence of emissions of volatile organic compounds (VOC's) into the environment from the surface coatings of these plastic parts. Metal enclosures are coated either to improve their appearance or to protect them from environmental stresses. The coatings normally used on metal cabinets and cases are not high in solids or VOC's. Plastic parts, on the other hand, are coated for three major reasons:

a) to improve their appearance
b) to protect the plastic part from physical and chemical stress and
c) to attenuate EMI/RFI.

Because of the nature of plastic and the different requirements of conventional coatings to ensure long-term adhesion to the plastic substrate, these surface coatings are high in solids in an organic solvent formulation. It can be assumed that the level of VOC emissions will increase as the conversion from metal to plastic proceeds and as electronic equipment manufacturers specify an ever growing amount of surface coatings for decorative and more importantly EMI/RFI attenuation purposes.

The major problem observed by the shift from metal enclosures is the absence of inherent EMI/RFI and ESD capabilities. Where cold rolled steel or die cast zinc was used for an enclosure these metals provided the conductivity to deal with EMI entering or exiting the enclosure. Only the apertures where emissions could leak in or out (e.g., seams, air vents, cable entry points etc.) had to be shielded for EMI. In the case of nonconductive plastics, every square inch of surface as well as the apertures, have to be shielded for EMI, as well as treated for ESD.

To overcome the disadvantages associated with the use of a plastic enclosure for electronic equipment it has been discovered that the composition of the present invention, i.e. a U.V. curable composition comprising a suspension of silver coated magnetic particles in a cycloaliphatic epoxy resin binder and a cationic photoinitiator provides an effective shield against EMI (electromagnetic interference), RFI (radio frequency interference) or EDS (electrostatic discharge).

While the term "EMI shielding" may be somewhat loosely employed in the plastics and electronics industry, nonetheless, the following is an explanation of what this term means in this field.

There is both natural and man-made electromagnetic radiation (EMR), and any man-made piece of digital electronic equipment with a clock emits in operation an amount of electromagnetic energy; the faster the clock setting, the greater the amount of energy emitted. Digital devices utilizing small integrated circuits and microprocessors can generate a significant amount of EMR. This EMR can travel out to come into contact with the conductors of another digital device such as the power cable, printed circuit boards, and various connecting wires within the device. The EMR generates a current independent of the operating current by inducing current flow in the conductors. A circuit board will receive and respond to this current just as if it were receiving the regular operating current. In other words, this random signal is giving extraneous electrical "instructions" to the device that can cause unwanted program or data changes. In this example EMR becomes EMI.

The 10 KHz is the lower boundary for regulations enforced by the FCC. The problem of emission of and susceptibility to EMR in this frequency range is referred to as radio frequency interference (RFI). This is the range that U.S. and international regulatory agencies such as the FCC and VDE are concerned with and is the range that the composition of the present invention has been found to control.

Static is a natural phenomenon where a rapid flow of electrons moves from an electrically charged object to another object to equalize the potential difference between them. The rapid flow of electrons can also induce current flow in conductors by creating EMR. For example, under low humidity conditions a person walking across a room can act as a capacitor and build up a charge potential of 10,000 volts or more. This phenomenon is known as electrostatic discharge (ESD).

Any piece of electrical or electronic equipment when put into operation generates electromagnetic waves composed of electrical (E vector) and magnetic (H vector) impulses. The magnetic impulses can penetrate all plastic and metal materials except ferrous materials, but magnetic signals terminate fairly rapidly over a short distance. Electric fields, on the other hand, can penetrate plastics, but not grounded metals. These signals can travel much greater distances. Thus, in electromagnetic energy the electrical field is the more potent and potentially more disruptive force.

Computing devices generate timing signals and pulses at rates of over one million pulses per second in order to carry out control and logic functions quickly and efficiently. This electromagnetic and radio frequency energy is radiated into space and conducted as well through media such as power lines. This energy has the potential to interfere with all forms of conventional electrical and electronic-radio, telephone and television reception.

The most common form of ESD can generate EMI, such as walking across a carpet and touching an object like an electronic device. The conductivity required of the receptor to protect against ESD is not as great as that required against EMI from a computing device so that even a plastic enclosure which is inherently insulative can protect against some mild forms of ESD. But nevertheless, charges can build up in plastic, and they will remain there until sufficient charge is accumulated to be discharged to a grounded susceptor. If the unit is not properly grounded, a sufficient charge may build up and the cumulative electron flow can arc to the circuitry and cause an EMI problem.

To achieve electromagnetic compatibility (not generating nor being susceptible to EMI, RFI, or ESD), an electronic unit has to be designed in such a way to minimize these emissions or susceptibility. The enclosure also has to be conducted in such a way as to trap any residual inward or outward EMI emissions.

The control of electromagnetic interference involves essentially a shield to contain or envelop the signals. When an electromagnetic wave encounters a shield, it will be reflected back to some extent if the impedance of the wave and that of the shield differ significantly. Highly conductive metals have a low impedance and they serve to reflect back the electromagnetic wave. In contrast, a low impedance magnetic wave encountering metal with a close match in impedance will result in a transfer of energy through the metal. Magnetic waves can be very difficult to shield. Over greater distances the electric field component dominates, and it is this factor which has to be dealt with through EMI/RFI shielding.

Electromagnetic waves pass through space or through nonconductive solid materials at $3 \times 10^8$ m/sec. When shielding on a nonconductive material, such as most plastics, is employed, these waves strike the shield, and some of their energy is reflected back just as light reflects off a mirror. The rest of the energy may be absorbed in the shield, further attenuating the wave's strength. Technically, there may be a further loss of the field's strength when the residual energy reaches the external perimeter of the shielding.

It is an important point to note that in the context of comparing the various shielding methods to the shielding composition of the present invention, the relative thickness of the shielding material has little effect on the reflected element of the wave, but it has a strong effect on its absorption. At higher frequencies, reflection decreases and absorption increases, so the greater attenuation of thicker barriers is important when dealing with higher frequency outputs.

It is also important to note at this stage that the absorption effect of an EMI shield will differ depending on whether the shielding material is entirely or partly conductive. This is an important distinction concerning the comparison of the shielding effectiveness of solid metal surfaces (ex: zinc arc spray) and metal-filled coatings (ex: nickel based acrylic binders) and the composition of the present invention.

In summary, electromagnetic energy is an energy field radiating from an electrical or electronic source containing both electric and magnetic field components. The field surrounding a highly electrically charged object is an electric field. Its presence is manifested by opposite charge objects clinging together or like charged objects separating. The field surrounding a highly magnetically charged object is a magnetic field. Its presence is manifested by the attraction of other magnetic materials in the same way that iron filings cling to a magnet.

In each case, the electric and the magnetic fields are static; their intensity is constant and there is no change in either their strength or their position. However, this can cause arcing. This arcing or electrostatic discharge (ESD) is a serious problem in switching electrical circuits since the separation of the switch or circuit breaker establishes an arc which must be extinguished in order to break the circuit. Static discharge can also cause problems through temporary delays in the transmission of signals.

While metal cabinets or enclosures provide effective protection against the build-up of static due to their natural conductivity, plastics will not. Effective dissipation of ESD is dependent on the placement of the electronic components within the cabinet and other design considerations. However, in the area of EMI shielding which is potentially far more serious, the solutions have tended to center around providing a metallic coating or infrastructure to the nonconductive plastic to reduce the ESD to a minimum.

The static nature of ESD leads to relatively straightforward solutions to the problem; the level of shielding required to eliminate ESD is generally fairly low. Electromagnetic fields, on the other hand, are not static; their intensity varies and their polarity alternates. The rate at which the field alternates is the frequency, measured in cycles per second or Hertz; this applies to both the electric and the magnetic field components.

The effectiveness of an EMI shield, as measured by dB, is referred to as attenuation. Each 10 dB increment of attenuation or dissipation of energy provides a 10 fold improvement in shielding effectiveness. A 10 dB attenuation results in a 90% attenuation of the force field; 20 dB yields a 99% reduction; 30 dB yields a 99.9% reduction and so on. In the area of computing devices generally, EMI shielding in the 1-1000 MHz range with an attenuation of 30-40 dB is sufficient to comply with government regulations in 95% of all existing business machine applications.

For electric fields, reflection is very large relative to absorption and it occurs primarily on the surface of the part. This is why thin shields, such as those obtained by electroless plating, vacuum deposition, and other thin film metal deposition technologies are very effective in attenuating electric fields. Conversely, the primary re-flection of magnetic fields is re-reflection within the shield. Thus, the attenuation of magnetic fields is best accomplished through thick skin shields, such as those produced by conductive coatings and zinc arc spray, and by high magnetic permeability of the shield material. An important point is that prior to the development of the shielding material of the present invention there was no one "perfect" shielding material. Unique to the shielding material of the present invention is the high conductivity of the silver coating and the high magnetic permeability of the magnetite spheres.

The proliferation of EMI and the response to this growth by various regulatory agencies is attributable to three basic forces. First, it is due to the tremendous growth of electronics as an enhancement to productivity in every aspect of modern life. Secondly, the typical piece of electronic equipment is more powerful; in other words, the clocks are working at a faster pace to input and output the data. Thirdly, there has been a very significant conversion from metal to plastic enclosures for this equipment. And, whereas most metals offer a high level of inherent conductivity, plastics are insulative in nature, so they are transparent to EMI.

While there has been significant activity in the development of inherently conductive plastics, nonetheless, those developed thus far while exhibiting modest amounts of conductivity, suffer from, interalia, the following disadvantages:

a) the materials are only available in sheet form and
b) they are highly sensitive to moisture and air.

Hence, at this time, one principal way to render a plastic material conductive is to metallize it—either by the incorporation of metal fillers into a plastic compound or by surface treatment using pure metal or metal based coating. While plastics may have replaced metals in the structure of the enclosures, they still have to rely on the metals in a plastic/metal marriage to provide all the properties required of an enclosure that will comply with EMI/RFI regulations.

As can be seen from the data in the table below, the shielding composition of the present invention exhibits significant advantages as an RFI and EMI absorber.

| Metal | Relative Conductivity[a] | Relative Permeability[a] |
|---|---|---|
| Silver | 1.05 | 1 |
| Iron | 0.17 | 1,000 |

[a]Relative to copper

Further, the shielding material of the present invention contains no volatile organic compounds (VOCs), and it has been demonstrated that a two mil coating of the shielding composition of the present invention provides the same shielding effectiveness as a three mil coating of zinc arc.spray or three mils of nickel acrylic coating. This range is in the neighborhood of 40-60 Db.

What is claimed is:

1. A method of fabricating a shielded plastic enclosure for housing electronic equipment, comprising the steps of:

applying a layer to at least one interior surface of said enclosure of a shielding composition comprising a suspension of silver-coated magnetite particles in a U.V. curable resin, said shielding composition being applied in an amount sufficient such that the resulting layer of said shielding composition has a thickness to effectively shield against electromagnetic interference, radio frequency interference or electrostatic discharge; and effecting U.V. radiation cure of the said U.V. curable resin by exposing said shielding composition to a U.V. source having an output in the region between 360 nm and 420 nm for a time sufficient to cure said U.V. curable resin.

2. The method of claim 1 wherein said shielding composition comprises a mixture of a cycloaliphatic epoxy resin and a cationic photoinitiator.

3. The method of claim 1 wherein said shielding composition also contains a plasticizer.

4. The method of claim 1 wherein said shielding composition contains by volume 25 to 67 percent silver-coated magnetite spheres based on the total volume of said shielding composition.

5. The method of claim 3 wherein said plasticizer is polyether polyol.

* * * * *